(12) United States Patent
D'Evelyn et al.

(10) Patent No.: US 8,482,104 B2
(45) Date of Patent: Jul. 9, 2013

(54) METHOD FOR GROWTH OF INDIUM-CONTAINING NITRIDE FILMS

(75) Inventors: Mark P. D'Evelyn, Goleta, CA (US); Christiane Poblenz, Goleta, CA (US); Michael R. Krames, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 13/346,507

(22) Filed: Jan. 9, 2012

(65) Prior Publication Data
US 2012/0199952 A1    Aug. 9, 2012

(51) Int. Cl.
*H01L 29/20*    (2006.01)
(52) U.S. Cl.
USPC .............. 257/615; 257/E21.09; 257/E29.089; 438/615
(58) Field of Classification Search
USPC .................................. 438/478, 503, 507, 509
See application file for complete search history.

(56) References Cited

U.S. PATENT DOCUMENTS

| | | | |
|---|---|---|---|
| 3,245,760 A | 4/1966 | Sawyer | |
| 3,303,053 A | 2/1967 | Strong et al. | |
| 3,335,084 A | 8/1967 | Hall | |
| 4,030,966 A | 6/1977 | Hornig et al. | |
| 4,430,051 A | 2/1984 | Von Platen | |
| 5,868,837 A | 2/1999 | DiSalvo et al. | |
| 6,090,202 A | 7/2000 | Klipov | |
| 6,129,900 A | 10/2000 | Satoh et al. | |
| 6,152,977 A | 11/2000 | D'Evelyn | |
| 6,350,191 B1 | 2/2002 | D'Evelyn | |
| 6,372,002 B1 | 4/2002 | D'Evelyn et al. | |
| 6,398,867 B1 | 6/2002 | D'Evelyn et al. | |
| 6,406,776 B1 | 6/2002 | D'Evelyn | |
| 6,455,877 B1 | 9/2002 | Ogawa et al. | |
| 6,475,254 B1 | 11/2002 | Saak et al. | |
| 6,533,874 B1 | 3/2003 | Vaudo et al. | |
| 6,541,115 B2 | 4/2003 | Pender et al. | |
| 6,596,040 B2 | 7/2003 | Saak et al. | |
| 6,596,079 B1 | 7/2003 | Vaudo et al. | |
| 6,639,925 B2 | 10/2003 | Niwa et al. | |
| 6,656,615 B2 | 12/2003 | Dwilinski et al. | |

(Continued)

FOREIGN PATENT DOCUMENTS

| JP | 2005-289797 A2 | 10/2005 |
|---|---|---|
| JP | 2007-039321 A | 2/2007 |

(Continued)

OTHER PUBLICATIONS

USPTO Office Action for U.S. Appl. No. 12/497,969 dated Jul. 5, 2012.

(Continued)

*Primary Examiner* — Zandra Smith
*Assistant Examiner* — Paul Patton
(74) *Attorney, Agent, or Firm* — Kilpatrick Townsend & Stockton LLP

(57) ABSTRACT

A method for growth of indium-containing nitride films is described, particularly a method for fabricating a gallium, indium, and nitrogen containing material. On a substrate having a surface region a material having a first indium-rich concentration is formed, followed by a second thickness of material having a first indium-poor concentration. Then a third thickness of material having a second indium-rich concentration is added to form a sandwiched structure which is thermally processed to cause formation of well-crystallized, relaxed material within a vicinity of a surface region of the sandwich structure.

24 Claims, 7 Drawing Sheets

U.S. PATENT DOCUMENTS

| | | |
|---|---|---|
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall et al. |
| 7,009,215 B2 | 3/2006 | D'Evelyn et al. |
| 7,012,279 B2 | 3/2006 | Wierer, Jr. et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,335,262 B2 | 2/2008 | Dwilinski et al. |
| 7,338,828 B2 | 3/2008 | Imer et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,569,206 B2 | 8/2009 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128459 A1 | 6/2005 | Zwet et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park |
| 2007/0142204 A1 | 6/2007 | Park et al. |
| 2007/0151509 A1 | 7/2007 | Park |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |

| | | | |
|---|---|---|---|
| 2008/0230765 A1 | 9/2008 | Yoon et al. | |
| 2008/0272462 A1 | 11/2008 | Shimamoto | |
| 2008/0282978 A1 | 11/2008 | Butcher et al. | |
| 2008/0285609 A1 | 11/2008 | Ohta et al. | |
| 2008/0298409 A1 | 12/2008 | Yamashita et al. | |
| 2009/0078955 A1 | 3/2009 | Fan et al. | |
| 2009/0092536 A1 | 4/2009 | Kawabata et al. | |
| 2009/0146170 A1 | 6/2009 | Zhong et al. | |
| 2009/0213593 A1 | 8/2009 | Foley et al. | |
| 2009/0218593 A1 | 9/2009 | Kamikawa et al. | |
| 2009/0250686 A1 | 10/2009 | Sato et al. | |
| 2009/0301387 A1 | 12/2009 | D'Evelyn | |
| 2009/0301388 A1 | 12/2009 | D'Evelyn | |
| 2009/0309110 A1 | 12/2009 | Raring et al. | |
| 2009/0320744 A1 | 12/2009 | D'Evelyn | |
| 2009/0320745 A1 | 12/2009 | D'Evelyn et al. | |
| 2010/0001300 A1 | 1/2010 | Raring et al. | |
| 2010/0003492 A1 | 1/2010 | D'Evelyn | |
| 2010/0025656 A1 | 2/2010 | Raring et al. | |
| 2010/0031872 A1 | 2/2010 | D'Evelyn | |
| 2010/0031873 A1 | 2/2010 | D'Evelyn | |
| 2010/0031874 A1 | 2/2010 | D'Evelyn | |
| 2010/0031875 A1 | 2/2010 | D'Evelyn | |
| 2010/0031876 A1 | 2/2010 | D'Evelyn | |
| 2010/0032691 A1 | 2/2010 | Kim | |
| 2010/0108985 A1 | 5/2010 | Chung et al. | |
| 2010/0109030 A1 | 5/2010 | Krames et al. | |
| 2010/0109126 A1* | 5/2010 | Arena | 257/615 |
| 2010/0117101 A1 | 5/2010 | Kim et al. | |
| 2010/0117118 A1 | 5/2010 | Dabiran et al. | |
| 2010/0147210 A1 | 6/2010 | D'Evelyn | |
| 2010/0151194 A1 | 6/2010 | D'Evelyn | |
| 2010/0219505 A1 | 9/2010 | D'Evelyn | |
| 2010/0295088 A1 | 11/2010 | D'Evelyn et al. | |
| 2011/0017298 A1 | 1/2011 | Lee | |
| 2011/0100291 A1 | 5/2011 | D'Evelyn | |
| 2011/0108081 A1 | 5/2011 | Werthen et al. | |
| 2011/0121331 A1 | 5/2011 | Simonian et al. | |
| 2011/0175200 A1 | 7/2011 | Yoshida | |
| 2011/0183498 A1 | 7/2011 | D'Evelyn | |
| 2011/0220912 A1 | 9/2011 | D'Evelyn | |
| 2011/0256693 A1 | 10/2011 | D'Evelyn et al. | |
| 2011/0262773 A1 | 10/2011 | Poblenz et al. | |
| 2012/0000415 A1 | 1/2012 | D'Evelyn et al. | |
| 2012/0007102 A1 | 1/2012 | Feezell et al. | |
| 2012/0073494 A1 | 3/2012 | D'Evelyn | |
| 2012/0091465 A1 | 4/2012 | Krames et al. | |
| 2012/0118223 A1 | 5/2012 | D'Evelyn | |
| 2012/0137966 A1 | 6/2012 | D'Evelyn et al. | |
| 2012/0178215 A1 | 7/2012 | D'Evelyn | |
| 2012/0187412 A1 | 7/2012 | D'Evelyn et al. | |

FOREIGN PATENT DOCUMENTS

| | | |
|---|---|---|
| WO | WO 2005121415 A1 | 12/2005 |
| WO | 2006/057463 | 6/2006 |
| WO | WO2007-004495 | 1/2007 |
| WO | WO2012-016033 | 2/2012 |

OTHER PUBLICATIONS

USPTO Office Action for U.S. Appl. No. 12/534,843 dated Sep. 10, 2012.
USPTO Notice of Allowance for U.S. Appl. No. 12/534,849 dated Jul. 31, 2012.
USPTO Notice of Allowance for U.S. Appl. No. 12/785,404 dated Jul. 16, 2012.
USPTO Office Action for U.S. Appl. No. 13/179,346 dated Aug. 17, 2012.
USPTO Notice of Allowance for U.S. Appl. No. 13/425,304 dated Aug. 22, 2012.
Byrappa et al., "Handbook of Hydrothermal Technology: A Technology for Crystal Growth and Materials Processing," Noyes Publications, Park Ridge, New Jersey, 2001, pp. 94-96 and 152.
Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

Chiang et al. "Luminescent Properties of Cerium-Activated Garnet Series Phosphor: Structure and Temperature Effects," Journal of the Electrochemical Society 155:B517-B520 (2008).
Chiu et al. "Synthesis and Luminescence Properties of Intensely Red-Emitting M5Eu $(WO_4)_{4-x}(MoO_4)_x$ (M = Li, Na, K) Phosphors," Journal of the Electrochemical Society 15:J71-J78 (2008).
Ci et al. "$Ca_{1-x}{}^{Mo}{}_{1-y}Nb_yO_4$:$Eu_x{}^{3+}$: A novel red phosphor for white light emitting diodes," Journal of Physics 152:670-674 (2008).
D'Evelyn et al., "Bulk GaN Crystal Growth by the High-Pressure Ammonothermal Method," Journal of Crystal Growth, 2007, vol. 300, pp. 11-16.
Dwiliński et al, AMMONO Method of BN, AlN, and GaN Synthesis and Crystal Growth,: Journal of Nitride Semiconductor Research, 1998, 3,25, MRS, Internet: http://nsr.mij.mrs.org.
Dwilinski et al., "Excellent Crystallinity of Truly Bulk Ammonothermal GaN," Journal of Crystal Growth, 2008, vol. 310, pp. 3911-3916.
Ehrentraut et al., "Prospects for the Ammonothermal Growth of Large GaN Crystal," Journal of Crystal Growth, 2007, vol. 305, pp. 304-310.
Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.
Feezell et al, "AlGaN-Cladding-Free Nonpolar InGaN/GaN Laser Diodes," Japanese Journal of Applied Physics, vol. 46, No. 13, pp. L284-L286 (Mar. 2007).
Frayssinet et al., "Evidence of Free Carrier Concentration Gradient Along the c-axis for Undoped GaN Single Crystals," Journal of Crystal Growth, 2001, vol. 230, pp. 442-447.
Fukuda et al. "Prospects for the ammonothermal growth of large GaN crystal," Journal of Crystal Growth 305: 304-310 (Jul. 2007).
Happek "Development of Efficient UV-LED Phosphor Coatings for Energy Saving Solid State Lighting" University of Georgia (Jan. 2007).
Hashimoto et al. "Ammonothermal growth of bulk GaN," Journal of Crystal Growth 310:3907-3910 (Aug. 2008).
Hashimoto et al. "A GaN bulk crystal wit improved structural quality grown by the ammonothermal method," Nature Materials 6:568-671 (Jul. 2007).
Höppe et al. "Luminescence in $Eu^{2+}$-doped $Ba_2$-$Si_5 N_8$: fluorescence, thernoliminescence, and upconversion"; Journal of Physics and Chemistry of Solids 61:2001-2006 (2000).
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kim et al, "Improved Electroluminescence on Nonpolar m-plane InGaN/GaN Qantum Well LEDs", 2007, Physica Status Solidi (RRL), vol. 1, No. 3, pp. 125-127.
Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.
Kolis et al., "Crystal Growth of Gallium Nitride in Supercritical Ammonia," Journal of Crystal Growth, 2001, vol. 222, pp. 431-434.
Kolis et al., "Materials Chemistry and Bulk Crystal Growth of Group III Nitrides in Supercritical Ammonia" Mat. Res. Soc. Symp. Proc., 1998, vol. 495, pp. 367-372.
Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.
Li et al. "The effect of replacement of Sr by Ca on the structural and luminescence properties of the red-emitting $Sr_2Si_5N_8$:$Eu_{2+}$ LED conversion phosphor," Journal of Solid State Chemistry 181:515-524 (2008).
Mirwald et al., "Low-Friction Cell for Piston-Cylinder High Pressure Apparatus," Journal of Geophysical Research, 1975, vol. 80, No. 11, pp. 1519-1525.
Motoki et al. "Growth and Characterization of Freestanding GaN Substrates," Journal of Crystal Growth, 2002, vol. 237-239, pp. 912-921.
Mueller-Mach et al. "Highly efficient all-nitride phosphor-converted white light emitting diode," Physica Status Solidi (a) 202:1727-1732 (Jul. 2005).

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sarva, et al. "Dynamic compressive strength of silicon carbide under uniaxial compression," Mat. Sci. & Eng. A 317,140 (2001).

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Setlur et al. "Crystal chemistry and luminescence of $Ce^{3+}$-doped $(Lu_2CaMg_2)$-Ca-2(Si, $Ge)_3O_{12}$ and its use in LED based lighting," Chemistry of Materials 18: 3314-3322 (2006).

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on m-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al. "Ammonothermal growth of GaN crystals in alkaline solutions," Journal of crystal Growth 287:376-380 (Jan. 2006).

Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Yamamoto "White LED phosphors: the next step," Proceeding of . SPIE (2010).

Yang et al. "Preparation and luminescence properties of LED conversion novel phosphors $SrZnO_2$:Sm," Materials Letters 62:907-910 (Mar. 2008).

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

International Search Report of PCT Application No. PCT/US2009/48489, dated Sep. 14, 2009, 3 pages total.

USPTO Office Action for U.S. Appl. No. 12/491,176 dated Mar. 1, 2012.

Lide et al., 'Thermal Conductivity of Ceramics and Other Insulating Materials,' CRC Handbook of Chemistry and Physics, 91st Edition, 2010-2011, pp. 12-203 and 12-204.

http://www.matbase.com/material/non-ferrous-metals/other/molybdenum/properties, Data Table for: Non-Ferrous Metals: Other Metals: Molybdenum.

Pattison et al., 'Gallium Nitride Based Microcavity Light Emitting Diodes With 2λ Effective Cavity Thickness', Applied Physics Letters, vol. 90, Issue 3, 031111 (2007) 3pg.

USPTO Office Action for U.S. Appl. No. 12/133,364 dated Nov. 26, 2010.

USPTO Office Action for U.S. Appl. No. 12/133,364 dated Jun. 1, 2011.

USPTO Notice of Allowance for U.S. Appl. No. 12/133,364 dated Oct. 11, 2011.

USPTO Office Action for U.S. Appl. No. 12/133,365 dated Jun. 9, 2011.

USPTO Office Action for U.S. Appl. No. 12/133,365 dated Oct. 18, 2011.

USPTO Office Action for U.S. Appl. No. 12/334,418 dated Apr. 5, 2011.

USPTO Office Action for U.S. Appl. No. 12/334,418 dated Oct. 19, 2011.

USPTO Office Action for U.S. Appl. No. 12/478,736 dated Sep. 27, 2011.

USPTO Office Action for U.S. Appl. No. 12/478,736 dated Feb. 7, 2012.

USPTO Notice of Allowance for U.S. Appl. No. 12/478,736 dated Apr. 23, 2012.

USPTO Office Action for U.S. Appl. No. 12/484,095 dated Nov. 10, 2010.

USPTO Office Action for U.S. Appl. No. 12/484,095 dated Jul. 8, 2011.

USPTO Office Action for U.S. Appl. No. 12/497,969 dated Feb. 2, 2012.

USPTO Office Action for U.S. Appl. No. 12/534,838 dated May 3, 2011.

USPTO Office Action for U.S. Appl. No. 12/534,838 dated Jan. 13, 2012.

USPTO Office Action for U.S. Appl. No. 12/534,838 dated Mar. 20, 2012.

USPTO Notice of Allowance for U.S. Appl. No. 12/534,838 dated Jun. 8, 2012.

USPTO Office Action for U.S. Appl. No. 12/534,844 dated Sep. 16, 2010.

USPTO Office Action for U.S. Appl. No. 12/534,844 dated Feb. 2, 2011.

USPTO Office Action for U.S. Appl. No. 12/534,857 dated Sep. 1, 2010.

USPTO Notice of Allowance for U.S. Appl. No. 12/534,857 dated May 27, 2011.

USPTO Office Action for U.S. Appl. No. 12/546,458 dated Jul. 20, 2011.

USPTO Notice of Allowance for U.S. Appl. No. 12/546,458 dated Nov. 28, 2011.

USPTO Office Action for U.S. Appl. No. 12/556,558 dated Sep. 16, 2010.

USPTO Notice of Allowance for U.S. Appl. No. 12/556,558 dated Mar. 22, 2011.

USPTO Office Action for U.S. Appl. No. 12/556,562 dated Sep. 15, 2010.

USPTO Office Action for U.S. Appl. No. 12/556,562 dated Mar. 21, 2011.

USPTO Notice of Allowance for U.S. Appl. No. 12/556,562 dated Jul. 27, 2011.

USPTO Office Action for U.S. Appl. No. 12/569,337 dated May 9, 2012.

USPTO Office Action for U.S. Appl. No. 12/569,841 dated Dec. 23, 2011.

USPTO Office Action for U.S. Appl. No. 12/634,665 dated Apr. 25, 2012.

USPTO Office Action for U.S. Appl. No. 12/724,983 dated Mar. 5, 2012.

USPTO Notice of Allowance for U.S. Appl. No. 12/754,886 dated May 17, 2012.

USPTO Notice of Allowance for U.S. Appl. No. 12/754,886 dated Jun. 5, 2012.

USPTO Notice of Allowance for U.S. Appl. No. 12/754,886 dated Jun. 20, 2012.

USPTO Office Action for U.S. Appl. No. 12/785,404 dated Mar. 6, 2012.

Choi et al., '2.51 microcavity InGaN light-emitting diodes fabricated by a selective dry-etch thinning process', Applied Physics Letters, 2007, 91(6), 061120.

Weisbuch et al., 'Recent results and latest views on microcavity LEDs', Light-Emitting Diodes: Research, Manufacturing, and Applications VIII, ed. by S.A. Stockman et al., Proc. SPIE, vol. 5366, p. 1-19 (2004).

USPTO Notice of Allowance for U.S. Appl. No. 12/478,736 dated Oct. 9, 2012.

USPTO Notice of Allowance for U.S. Appl. No. 12/569,337 dated Nov. 15, 2012.

USPTO Office Action for U.S. Appl. No. 12/569,844 dated Oct. 12, 2012.

USPTO Office Action for U.S. Appl. No. 12/634,665 dated Oct. 1, 2012.

USPTO Office Action for U.S. Appl. No. 12/891,668 dated Sep. 25, 2012.

USPTO Office Action for U.S. Appl. No. 13/025,833 dated Jul. 12, 2012.

USPTO Office Action for U.S. Appl. No. 13/041,199 dated Nov. 30, 2012.

USPTO Office Action for U.S. Appl. No. 13/175,739 dated Dec. 7, 2012.

USPTO Office Action for U.S. Appl. No. 13/179,346 dated Dec. 13, 2012.

USPTO Office Action for U.S. Appl. No. 13/226,249 dated Oct. 10, 2012.

USPTO Notice of Allowance for U.S. Appl. No. 12/534,843 dated Jan. 24, 2013.

Communication from the Polish Patent Office re P394857 dated Jan. 22, 2013, 2 pages.

USPTO Notice of Allowance for U.S. Appl. No. 12/634,665 dated Feb. 15, 2013.

USPTO Office Action for U.S. Appl. No. 13/041,199 dated Mar. 12, 2013.

USPTO Notice of Allowance for U.S. Appl. No. 13/226,249 dated Feb. 21, 2013.

* cited by examiner

METHOD FOR GROWTH OF INDIUM-CONTAINING NITRIDE FILMS

FIELD

The present disclosure relates generally to techniques for growing indium-containing nitride films. More specifically, the disclosure includes a process for forming materials such as InGaN and/or AlInGaN or AlInN that are nucleated heteroepitaxially directly on a substrate without first forming crystalline GaN. In various embodiments, deposition is performed at relatively low temperature, via molecular beam epitaxy, hydride vapor phase epitaxy, metalorganic chemical vapor deposition, or atomic layer epitaxy. There are other embodiments as well.

BACKGROUND

Indium-containing nitride films are important in a number of applications, including epitaxial InGaN layers in light-emitting diodes and laser diodes. Typically, these films are grown on a GaN layer, which in turn is either deposited heteroepitaxially on a non-GaN substrate such as sapphire or silicon carbide, or homoepitaxially on a bulk or quasi-bulk GaN substrate. Unfortunately, these conventional techniques are often inadequate. Thus, improved method and system for forming indium-containing nitride films are desirable.

BRIEF SUMMARY

The present disclosure relates generally to techniques for growing indium-containing nitride films. More specifically, the disclosure includes a process for forming materials such as InGaN and/or AlInGaN or AlInN that are nucleated heteroepitaxially directly on a substrate without first forming crystalline GaN. In various embodiments, deposition is performed at relatively low temperature, via molecular beam epitaxy, hydride vapor phase epitaxy, metalorganic chemical vapor deposition, or atomic layer epitaxy. There are other embodiments as well.

According to one embodiment, the disclosure provides a method for fabricating a gallium, indium, and nitrogen containing material. The method includes providing a substrate having a surface region. The method also includes forming a first thickness of material having a first indium-rich concentration. The method includes forming a second thickness of material having a first indium-poor concentration overlying the first thickness of material. The method additionally includes forming a third thickness of material having a second indium-rich concentration to form a sandwiched structure including at least the first thickness of material, the second thickness of material, and third thickness of material. Moreover, the method includes processing the sandwiched structure using at least a thermal process to cause formation of well-crystallized, relaxed material within a vicinity of a surface region of the sandwiched structure. The sandwiched structure has an overall thickness of 100 nm and greater.

According to another embodiment, the present disclosure provides an indium, gallium and nitrogen containing substrate structure. The structure includes a substrate comprising a surface region. The structure also includes a thickness of a gallium, indium, and nitrogen containing crystalline material overlying the surface region and configured in a stain free manner from an alternating sequence of at least two materials including an indium and nitrogen containing material and a gallium and nitrogen containing material. The thickness is at least 100 nm and is substantially strain-free and well-crystallized.

Among the benefits of the disclosed techniques are InGaN and/or AlInGaN or AlInN are nucleated heteroepitaxially directly on a substrate without first forming crystalline GaN. Deposition is performed at relatively low temperature, via molecular beam epitaxy, hydride vapor phase epitaxy, metalorganic chemical vapor deposition, or atomic layer epitaxy, in order to avoid undesired segregation and facet formation. The crystalline InGaN or AlInGaN or AlInN film formed thereupon has superior homogeneity at thicknesses greater than about 500 nm than the prior art. In a specific embodiment, the techniques according to the present disclosure can be performed in a relatively simple and cost effective manner. Depending upon the embodiment, the methods and systems according to the present disclosure can be performed using conventional materials and/or equipments according to one of ordinary skill in the art. There are other benefits as well.

A further understanding of the nature and advantages of the techniques of the disclosure may be realized by reference to the following specification and attached drawings.

DETAILED DESCRIPTION

Figure 1:
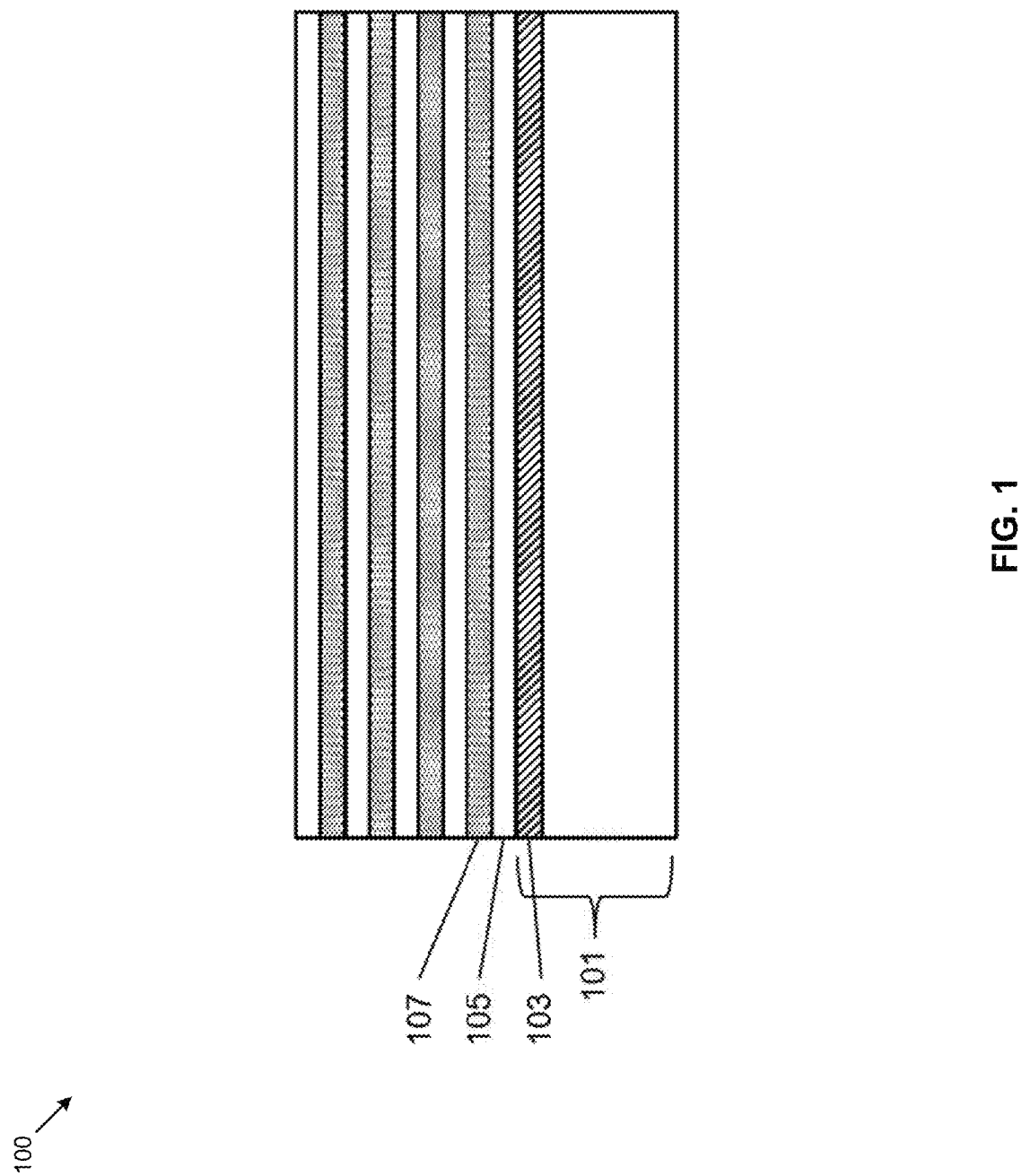
FIG. 1 is simplified diagram illustrating a substrate for processing according to an embodiment of the present disclosure.

The present disclosure relates generally to techniques for growing indium-containing nitride films. More specifically, the disclosure includes a process for forming materials such as InGaN and/or AlInGaN or AlInN that are nucleated heteroepitaxially directly on a substrate without first forming crystalline GaN. In various embodiments, deposition is performed at relatively low temperature, via molecular beam epitaxy, hydride vapor phase epitaxy, metalorganic chemical vapor deposition, or atomic layer epitaxy. There are other embodiments as well.

As explained above, conventional techniques for forming crystalline GaN and indium-containing nitride films are often inadequate and have various limitations. It is well known that as the fraction of InN in the InGaN layer increases beyond a certain point, the internal quantum efficiency for light emission decreases severely—a phenomenon known widely as the "green gap." The lattice constant of InN is significantly larger than that of GaN and, for higher In fractions in an InGaN layer, the crystallinity of the layer tends to be degraded for layers thick enough to be useful for many device applications. In some cases an InN or indium-containing nitride layer is deposited directly onto a dissimilar substrate, but the crystallinity and homogeneity are typically poor.

Thus it is to be appreciated that embodiments of the present disclosure provide an improved method for growing high quality indium-containing nitride layers and films with high crystallinity, homogeneity, and large area.

To provide a point of reference, it is useful to review the typical practice used to grow epitaxial indium-containing nitride layers such as $In_yGa_{1-y}N$ and $Al_xIn_yGa_{1-x-y}N$, where $0 \leq x \leq 1$ and $0 < y$, $x+y \leq 1$.

In the large majority of cases, a heteroepitaxial GaN layer is first deposited onto a substrate such as sapphire, silicon carbide, gallium arsenide, $MgAl_2O_4$ spinel, lithium aluminate, or the like. Heteroepitaxial growth is desirable from the standpoint of achieving large area, for example, because large-area sapphire and silicon carbide substrates are readily available. Nakamura developed a technique whereby a sapphire wafer is heated above 1000° C. in $H_2$ and/or $NH_3$, then cooled to 450-600° C. and a GaN nucleation layer a few hundred Angstroms thick is grown by metalorganic chemical vapor deposition (MOCVD). The substrate is then heated to about 1000-1100° C. and a relatively high crystalline quality GaN layer is grown by MOCVD. In some cases a relatively high crystalline quality $In_yGa_{1-y}N$ layer is deposited by MOCVD above the GaN layer, typically using trimethylindium, $In(CH_3)_3$, as the indium source and a substrate temperature between about 700° C. and about 850° C. and a film thickness less than about 500 nanometers. If significantly thicker $In_yGa_{1-y}N$ films are grown the morphology typically is degraded, especially for very high InN content InGaN. A straightforward generalization of this process to direct nucleation of InGaN films, unfortunately, does not work.

The mechanism by which the nucleation layer enables a relatively high quality GaN layer to be grown is reasonably well understood, as described by Koleske et al. As the nucleation layer is heated it undergoes partial decomposition and, through a combination of surface diffusion and evaporation of Ga atoms followed by reaction with incoming $NH_3$ molecules, begins to form nuclei of well-crystallized GaN which grow and eventually coalesce into a continuous film. Without wishing to be bound by theory, we believe that this process does not work with directly-nucleated InGaN layers for several reasons. InN and GaN decompose at different temperatures, have different surface diffusion characteristics, and different vapor pressures for Ga and In. If isolated nuclei of InGaN form, they will likely have facets of more than one crystallographic orientation. InN and GaN will tend to become incorporated into the different facets at different ratios, leading to a film with gross local stoichiometry variations once the nuclei have coalesced to form a continuous film. In addition, decomposition of $In(CH_3)_3$ becomes difficult at temperatures low enough for no significant decomposition or structural rearrangement of the nucleation layer to occur.

Referring to the diagram 100 of FIG. 1, a substantially indium-free substrate 101 is provided. This diagram is merely an example, which should not unduly limit the scope of the claims. One of ordinary skill in the art would recognize many variations, alternatives, and modifications. The substrate 101 may comprise one of sapphire, silicon carbide, gallium arsenide, silicon, germanium, a silicon-germanium alloy, $MgAl_2O_4$ spinel, ZnO, BP, $ScAlMgO_4$, $YFeZnO_4$, MgO, $Fe_2NiO_4$, $LiGa_5O_8$, $Na_2MoO_4$, $Na_2WO_4$, $In_2CdO_4$, $LiAlO_2$, $LiGaO_2$, $Ca_8La_2(PO_4)_6O_2$, lithium aluminate, gallium nitride, or aluminum nitride. The substrate may have a wurtzite crystal structure and the surface orientation may be within 5 degrees, within 2 degrees, within 1 degree, within 0.5 degree, within 0.2 degree, within 0.1 degree, within 0.05 degree, within 0.02 degree, or within 0.01 degree of (0 0 0 1)+c plane, (0 0 0 -1)-c plane, {1 0-1 0} m-plane, {1 1-2 0} a-plane, or a (h k i l) semi-polar plane, where l and at least one of h and k are nonzero and i=-(h+k). In a specific embodiment, the crystallographic orientation of the substrate is within 5 degrees, within 2 degrees, within 1 degree, within 0.5 degree, within 0.2 degree, within 0.1 degree, within 0.05 degree, within 0.02 degree, or within 0.01 degree of {1 0-1±1}, {1 0-1±2}, {1 0-1±3}, {1 1-2±2}, {2 0-2±1}, {3 0-3±1}, {2 1-3±1}, or {3 0-3±4}. The substrate may have a cubic crystal structure and the surface orientation may be within 5 degrees, within 2 degrees, within 1 degree, within 0.5 degree, within 0.2 degree, within 0.1 degree, within 0.05 degree, within 0.02 degree, or within 0.01 degree of (1 1 1), (-1 -1 -1), {0 0 1}, or {1 1 0}. The substrate may have a diameter greater than about 5 millimeters, greater than about 10 millimeters, greater than about 15 millimeters, greater than about 25 millimeters, greater than about 40 millimeters, greater than about 70 millimeters, greater than about 90 millimeters, greater than about 140 millimeters, or greater than about 190 millimeters.

In some embodiments, a mask 103 is deposited on the substrate and a one- or two-dimensional array of openings provided in the mask. The mask may comprise at least one of $SiO_2$, $SiN_x$, or a metal oxynitride. In some embodiments the substrate is patterned. And, in some embodiments, the substrate 101 further comprises a release layer, as described in U.S. patent application Ser. No. 12/546,458, which is hereby incorporated by reference in its entirety.

The substrate 101 may be placed in a reactor. The surface to be grown upon may be positioned facing up, facing down, facing horizontally, or facing in an oblique direction.

In one set of embodiments, differential incorporation of In into facets of non-coalesced films is avoided by deposition of alternating layers of high-indium layers 107 and low-indium layers 105, as shown in FIG. 1. At least one low-indium layer overlies a high-indium layer and at least one high-indium layer overlies a low-indium layer to form a sandwich structure. The high-indium layers may comprise InN and GaN, AlN, or AlGaN. For an indium-containing composition comprising $In_yGa_{1-y}N$ or $Al_xIn_yGa_{1-x-y}N$, where $0 \leq x \leq 1$ and $0 < y$, $x+y \leq 1$, the high-indium or indium-rich layer may have a value $y_{high}$ that is greater than 0.05, greater than 0.1, greater than 0.2, or greater than 0.4. For an indium-containing composition comprising $In_yGa_{1-y}N$ or $Al_xIn_yGa_{1-x-y}N$, where $0 \leq x \leq 1$ and $0 < y$, $x+y \leq 1$, the low-indium or indium-poor layer may have a value $y_{low}$ that is less than $y_{high}$, less than 0.05, less than 0.02, or less than 0.01. The low-indium layers may comprise GaN, AlN, AlGaN, and/or up to about 5% InN. A plurality of the high-indium layers and of the low-indium layers may have a thickness between about 0.01 monolayer and about 100 monolayers, or between about 0.1 monolayer and about 20 monolayers. The term monolayer refers to a single atomic layer of group III metal atoms (In, Ga, and/or Al) plus a single atomic layer of nitrogen atoms. The number of pairs of alternating layers may be greater than 1, greater than 10, greater than 100, greater than 1000, or greater than 10,000. The alternating layers may be deposited as nucleation layers, that is, may be poorly crystallized. The alternating layers may be deposited as well-crystallized layers. The alternating layers may be deposited directly on substrate 101, on release layer 103, or on a faceted nucleation layer formed on substrate 101 or on release layer 103. The thickness of the alternating layers may be greater than 100 nm, greater than 500 nm, greater than 1 micron, greater than 2 microns, greater than 5 microns, or greater than 10 microns.

Figure 2:
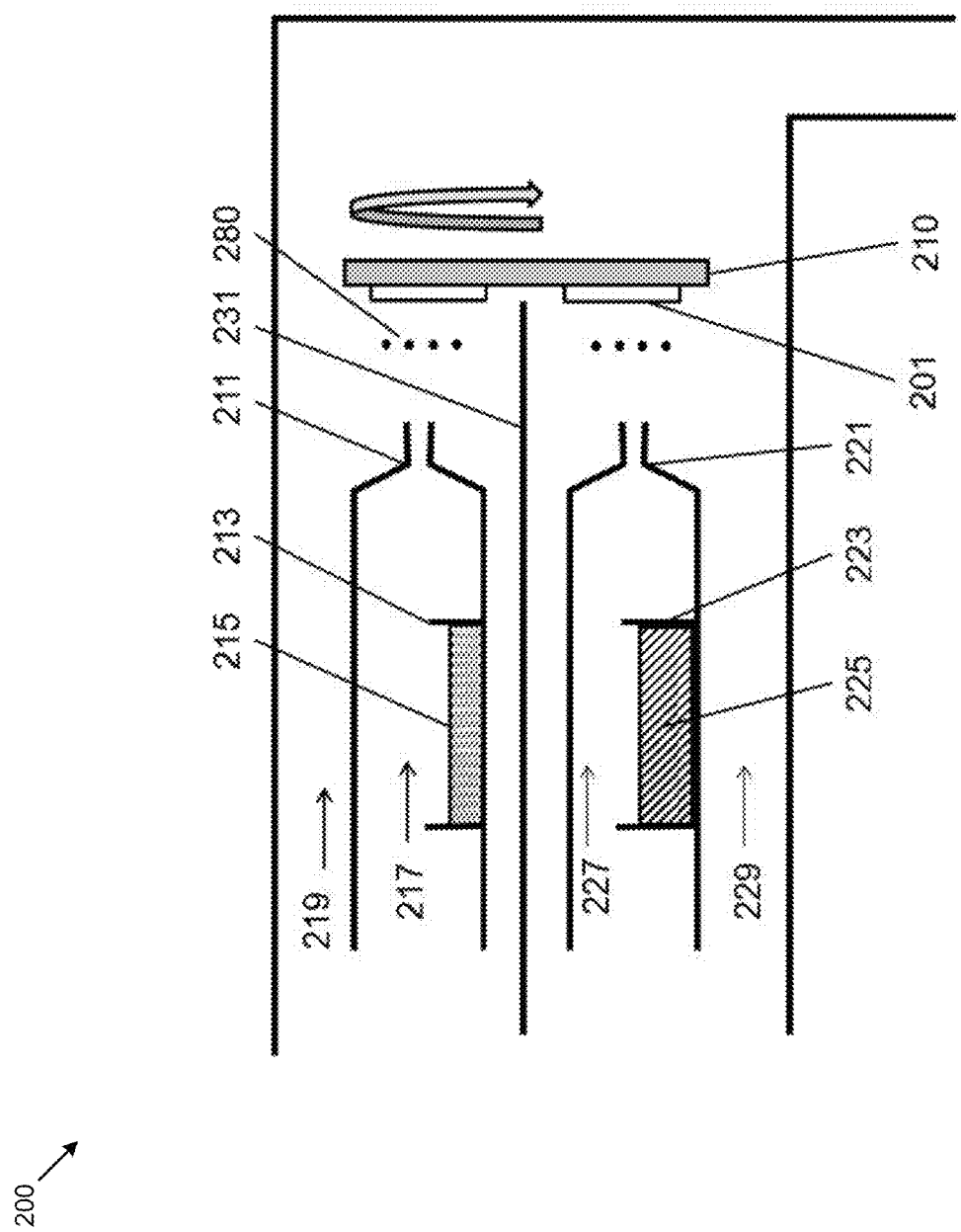
FIG. 2 is a simplified diagram illustrating using a reactor 200 for processing one or more substrates according to an embodiment of the present disclosure.

In one set of embodiments, alternating high-indium and low-indium layers are deposited by hydride vapor phase epitaxy (HVPE). Referring to FIG. 2, one or more substrates 201 may be placed on a susceptor 210 within reactor 200. Susceptor 210 may be provided with one or more recessed portions (not shown) so that the outward-facing surfaces of one or more substrates 201 may be approximately flush with respect to the outward-facing surface of susceptor 210. At least two metal halide sources 211 and 221 are provided. High-indium source 211 may comprise a crucible 213 which contains an indium-rich alloy 215. Low-indium source 221 may comprise a crucible 223 which contains an indium-poor alloy 225. Indium-rich alloy 215 may comprise indium. Indium-poor alloy 225 may comprise gallium. Halogen-containing gases 217 and 227 are passed over indium-rich alloy 215 and indium-poor alloy 225, respectively. Halogen-containing gases 217 and 227 may comprise $X_2$ or HX, where X is F, Cl, Br, or I. In a preferred embodiment, halogen-containing gases 217 and 227 comprise $Cl_2$. At least one of halogen-containing gases 217 and 227 may further comprise a carrier gas, such as hydrogen, helium, neon, argon, krypton, xenon, or nitrogen. Nitrogen-containing gases 219 and 229 are mixed with the effluent gases from high-indium and low-indium sources 211 and 221, respectively. In a preferred embodiment, nitrogen-containing gases 219 and 229 comprise ammonia. At least one of nitrogen-containing gases 219 and 229 may further comprise a carrier gas, such as hydrogen, helium, neon, argon, krypton, xenon, or nitrogen. The gases in the high-indium zone and in the low-indium zone may be inhibited from mixing prior to impinging up one or more substrates 201 by one or more baffles 231. Baffle 231 may have a relatively small clearance with respect to substrates 201 and susceptor 210, for example, less than 1 millimeter, less than 0.5 millimeter, less than 0.2 millimeter, or less than 0.1 millimeter. Reactor 200 may further be provided with temperature-controlled heating source for susceptor 210, high-indium source 211, and low-indium source 221. Susceptor 210 may rotate, so that one or more substrates 201 are alternately exposed to indium-rich and indium-poor growth environments. The absolute and relative rates of deposition of indium-rich and indium-poor layers may be adjusted by setting the temperatures of the indium-rich and of the indium-poor sources, the flow rate and mole fraction of halogen-containing gases over the indium-rich and the indium-poor alloys, the flow of nitrogen-containing gas, the reactor pressure, and the substrate temperature to pre-determined values. The number of alternating layers may be adjusted by setting the deposition time and the rotation rate of the susceptor to pre-determined values. The pressure at which the HVPE is performed may be below about 1 Torr, between about 1 Torr and about 10 Torr, between about 10 Torr and about 100 Torr, between about 100 Torr and about 760 Torr, between about 1 atmosphere and about 2 atmospheres, or above about two atmospheres.

In order to enable deposition of well-crystallized indium-rich and indium-poor layers at approximately the same substrate temperature, the reactor may be further equipped with one or more wires or heating elements 280 positioned proximate to the substrate(s), with a spacing between about 0.1 millimeter and about 10 centimeters to the surface. The wires or heating elements may be characterized by a temperature ranging from about 500 to about 2000 Degrees Celsius. The wires may be configured in any of the reactors described herein or illustrated schematically in FIGS. 2, 3, 4, and 6. In some embodiments, the one or more wires are positioned between about 1 millimeter and about 15 millimeters from the surface. The one or more wires may be substantially parallel to one another. The one or more wires may be fixtured so as to be under a controlled tension, so that they remain substantially straight when heated. The one or more wires may lie substantially in a common plane, with a spacing between one another between about 0.1 millimeter and about 10 centimeters. In one specific embodiment, the wires comprise a wire cloth having a two-dimensional weave. The one or more wires may comprise at least one of Hf, Ta, W, Re, Mo, Ni, Cr, Fe, Al, Ir, Pt, Pd, Rh, or Ru. The wires may comprise a compound, for example, $MoSi_2$. The one or more wires may further comprise a coating, such as $ThO_2$. In some embodiments, one or more ribbons or foil portions are used in addition to or in place of one or more wires.

Figure 3:
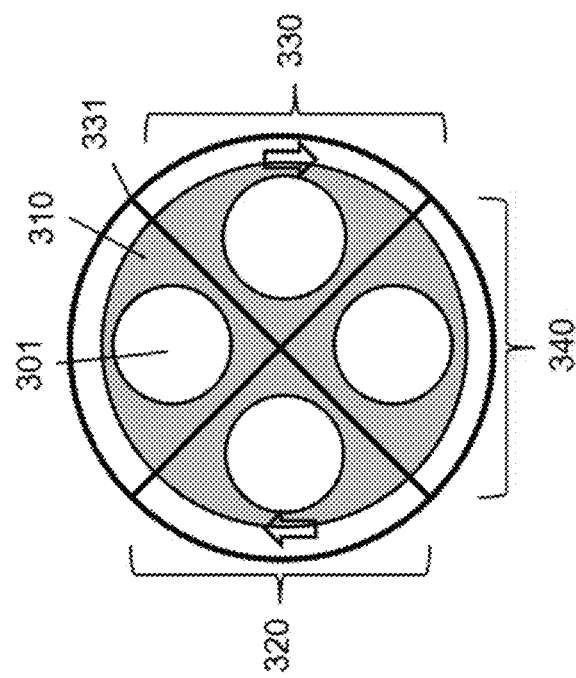
FIG. 3 shows a cross-sectional view of a reactor near the susceptor according to an embodiment of the present disclosure.
Figure 4:
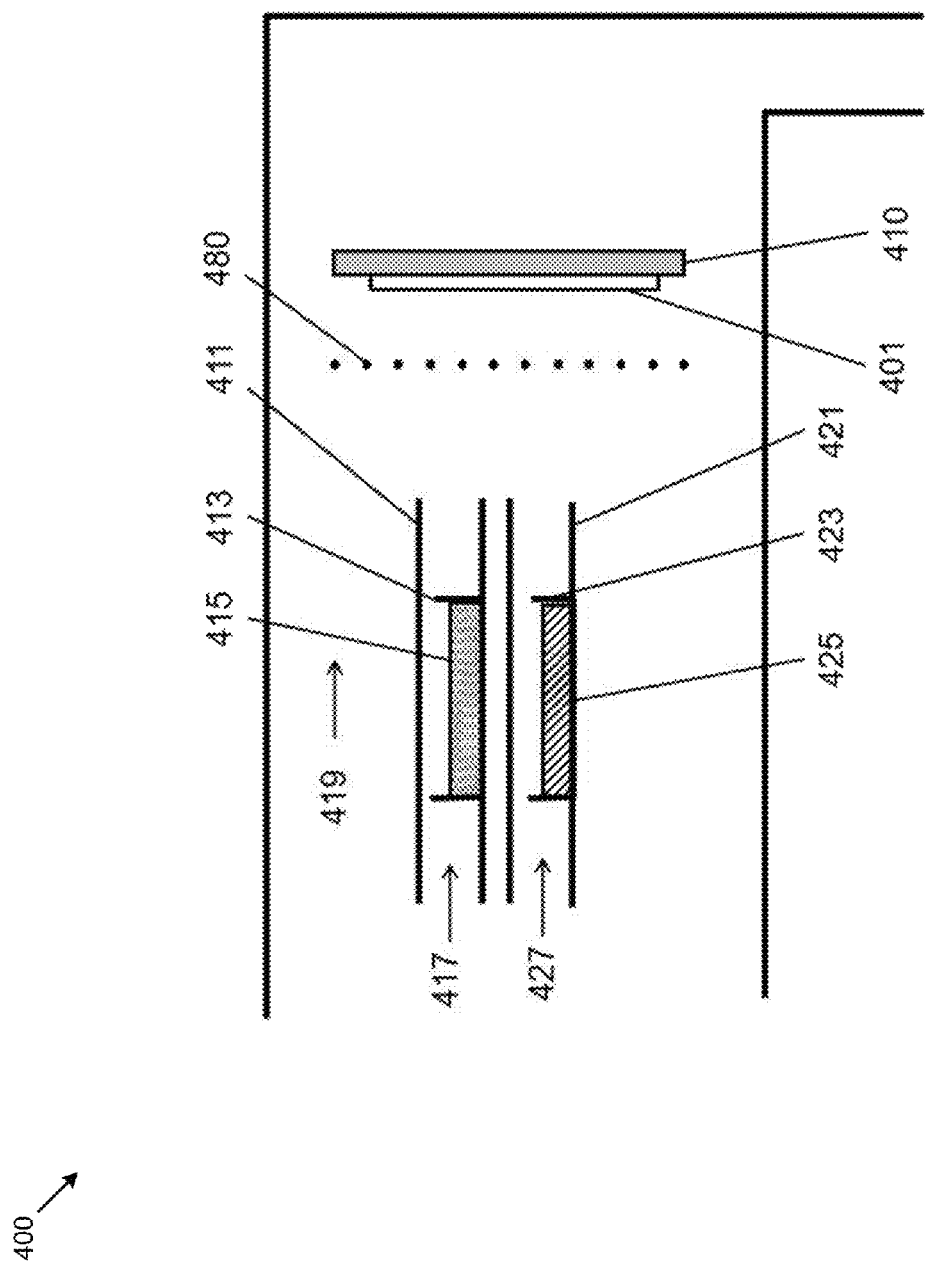
FIG. 4 is a simplified diagram illustrating using a reactor 400 for processing one or more substrates according to an embodiment of the present disclosure.

FIG. 3 shows a cross-sectional view of a reactor near the susceptor. This diagram is merely an example, which should not unduly limit the scope of the claims. One of ordinary skill in the art would recognize many variations, alternatives, and modifications. One or more substrates 301 are placed in or on susceptor 310, which is capable of rotating with respect to reactor 300. One or more baffles 331 separate reactor 300 into at least two zones. The at least two zones may include an indium-rich zone 320 and an indium-poor zone 330. At least one purge zone 340 may also be included. An inert or purge gas, such as at least one of hydrogen, helium, argon, or nitrogen, may flow over the substrate while in a purge zone. The purge zone may further inhibit inter-mixing of the gases from the indium-rich and indium-poor growth zones. The susceptor may rotate so that the time each substrate 301 is within a zone is between about 0.01 second and about 100 seconds, between about 0.1 second and about 10 seconds, or between about 0.3 second and about 3 seconds.

In another set of embodiments, the HVPE reactor is configured to be vertical instead of horizontal, as shown in FIGS. 2 and 3. In a specific embodiment, the one or more substrates face downward, with the indium-rich and indium-poor sources directed upwards. In another specific embodiment the one or substrates face upward, with the indium-rich and indium-poor sources directed downwards.

In a set of embodiments, the at least one substrate is exposed to alternating indium-rich and indium-poor growth conditions by means of a time-varying gas flow rather than by means of physical motion of the substrate. Referring to the reactor 400 of FIG. 4, at least one substrate 401 is placed proximate to susceptor 410. At least two metal halide sources 411 and 421 are provided. High-indium source 411 may comprise a crucible 413 which contains an indium-rich alloy 415. Low-indium source 421 may comprise a crucible 423 which contains an indium-poor alloy 425. Indium-rich alloy 415 may comprise indium. Indium-poor alloy 425 may comprise gallium. Halogen-containing gases 417 and 427 may be passed over indium-rich alloy 415 and indium-poor alloy 425, respectively. Halogen-containing gases 417 and 427 may comprise $X_2$ or HX, where X is F, Cl, Br, or I. In a preferred embodiment, halogen-containing gases 417 and 427 comprise $Cl_2$. Halogen-containing gases 417 and 427 may further comprise a carrier gas, such as hydrogen, helium, neon, argon, krypton, xenon, or nitrogen. Nitrogen-containing gas 419 is mixed with the effluent gases from high-indium and low-indium sources 411 and 421, respectively. In a preferred embodiment, nitrogen-containing gas 419 comprises ammonia. Nitrogen-containing gas 419 may further comprise a carrier gas, such as hydrogen, helium, neon, argon, krypton, xenon, or nitrogen. Reactor 400 may further be provided with temperature-controlled heating source for susceptor 410, high-indium source 411, and low-indium source 421. Substrate 401 is exposed to alternating indium-rich and indium-poor gas compositions by time variation of gases 417 and 427 over indium-rich alloy 415 and indium-poor alloy 425, respectively. The reactor may be further equipped with one or more wires 480 positioned proximate to the substrate(s).

Figure 5:
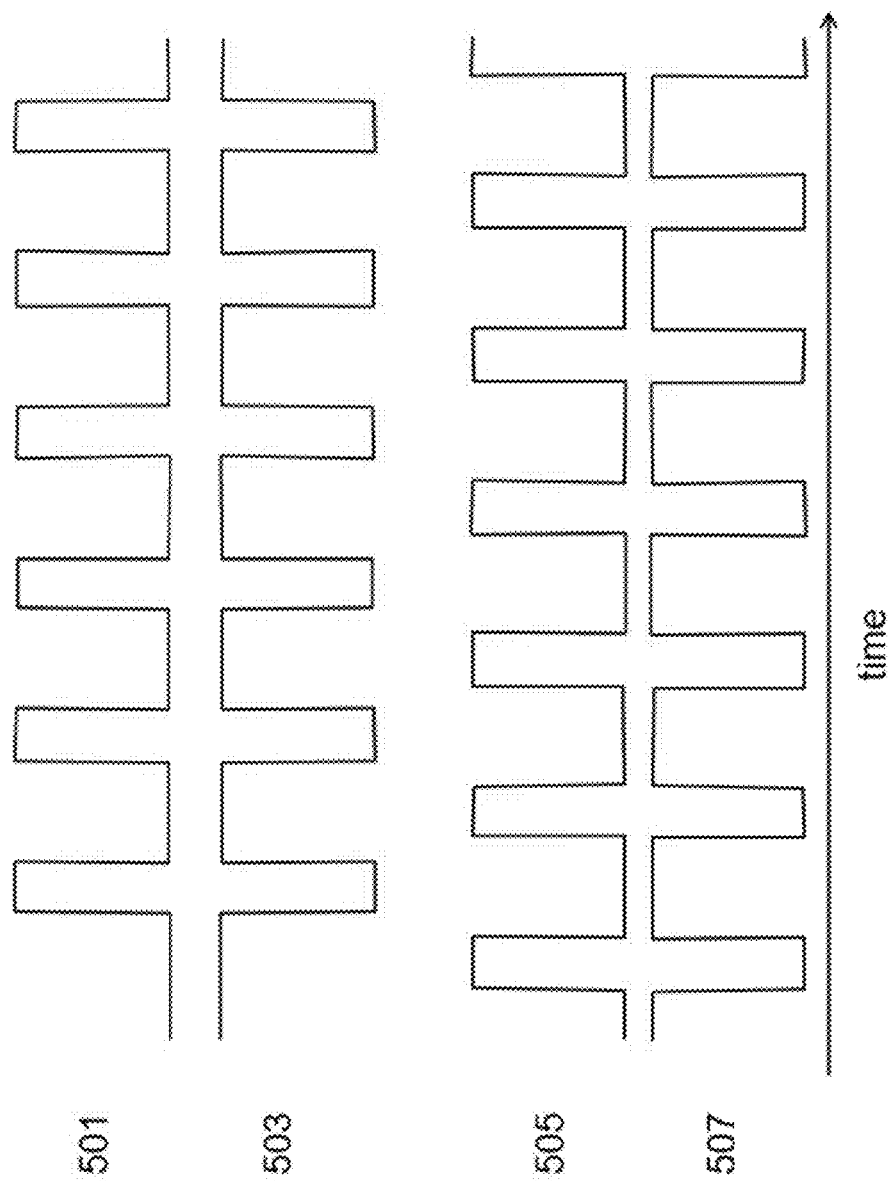
FIG. 5 illustrates a suitable sequence of gas flows to enable deposition of alternating indium-rich and indium-poor layers according to an embodiment of the present disclosure.

FIG. 5 shows, schematically, a suitable sequence of gas flows to enable deposition of alternating indium-rich and indium-poor layers. This diagram is merely an example, which should not unduly limit the scope of the claims. One of ordinary skill in the art would recognize many variations, alternatives, and modifications. Time-traces 501 and 503 may be taken to represent the flow of halogen-containing gas and of carrier gas, respectively, in the gas stream over the indium-rich alloy. The carrier gas flow is on when the halogen-containing gas flow is off, and vice-versa, so that the overall gas flow rate above the indium-rich alloy is approximately constant. Time-traces 505 and 507 may be taken to represent the flow of halogen-containing gas and of carrier gas, respectively, in the gas stream over the indium-poor alloy. The carrier gas flow is on when the halogen-containing gas flow is off, and vice-versa, so that the overall gas flow rate above the indium-poor alloy is approximately constant. The flow of halogen-containing gas above the indium-rich alloy is off while the flow of halogen-containing gas above the indium-poor alloy is on, and vice-versa. The on-times of the halogen-containing gas may be shorter than the off-times, allowing for separation in time of the indium-rich and indium-poor metal halide gas streams impinging on the substrate. The flow of nitrogen-containing gas, for example, ammonia, may be approximately constant during this sequence. The "on" times of the halogen-containing gas flows may be between about 0.01 second and about 100 seconds, between about 0.1 second and about 10 seconds, or between about 0.3 second and about 3 seconds.

Referring again to FIG. 4, in order to allow for a relatively clean transition between halogen-containing gas and carrier gas within each gas stream 417 and 427, the gas flow rate, gas pressure, and the diameter of sources 411 and 421 may be chosen so that the Peclet number for the gas flows is greater than 1, greater than 3, greater than 10, greater than 30, or greater than 100. The Peclet number $Pe=uL/D$, where u is the gas flow velocity, L is a characteristic length, and D is the diffusion coefficient, provides a quantitative measure of convective versus diffusive gas transport. The shapes of crucibles 413 and 423 may be chosen to minimize turbulence, eddies, and the like in the flow of gases 417 and 427, respectively.

The absolute and relative rates of deposition of indium-rich and indium-poor layers may be adjusted by setting the temperatures of the indium-rich and of the indium-poor sources, the flow rates, mole fractions, and on-times of the halogen-containing gases over the indium-rich and the indium-poor alloys, the flow rate of nitrogen-containing gas, the reactor pressure, and the substrate temperature to pre-determined values. The number of alternating layers may be adjusted by setting the deposition time and the cycle time for the alternating gas flows to pre-determined values. The pressure at which the HVPE is performed may be below about 1 Torr, between about 1 Torr and about 10 Torr, between about 10 Torr and about 100 Torr, between about 100 Torr and about 760 Torr, between about 1 atmosphere and about 2 atmospheres, or above about two atmospheres.

In another set of embodiments, alternating high-indium and low-indium layers are deposited by metalorganic chemical vapor deposition (MOCVD). In one set of embodiments, the deposition is performed in a reactor in which the substrate position is varied to alternate between indium-rich and indium-poor growth conditions. In one specific embodiment, the reactor is a tubular reactor. An example of a suitable apparatus is described in MA Tishchler and SM Bedair, Appl. Phys. Lett. 48, 1681 (1986), which is hereby incorporated by reference in its entirety. Note, however, that the inventive procedure is very different than that described by Tischler and Bedair. The instant process involves alternative exposure to indium-rich and indium-poor (gallium rich) metalorganic gas streams with continuous exposure to a nitrogen-containing gas, for example, ammonia. Tischler and Bedair teach alternating exposures to a metalorganic gas stream and an ammonia gas stream to achieve atomic layer epitaxy. Referring again to FIG. 3, a susceptor 310 holding one or more substrates 301 may be rotated proximate to at least two deposition zones. The gas flux in indium-rich deposition zone 320 may comprise at least one of trimethylindium, triethylindium, and cyclopentadienylindium and ammonia. The gas flux in indium-poor deposition zone 330 may comprise at least one of trimethylgallium, triethylgallium, and ammonia. At least one of the indium-rich and indium-poor metalorganic gas flows and the nitrogen-containing gas flow may further comprise a carrier gas, such as hydrogen, helium, neon, argon, krypton, xenon, or nitrogen. At least one purge zone 340 may also be included.

The absolute and relative rates of deposition of indium-rich and indium-poor layers may be adjusted by setting the flow rate and mole fraction of the indium-rich and the indium-poor metalorganic sources, the flow of nitrogen-containing gas, the reactor pressure, and the substrate temperature to pre-determined values. The number of alternating layers may be adjusted by setting the deposition time and the rotation rate of the susceptor to pre-determined values. The pressure at which the MOCVD is performed may be below about 1 Torr, between about 1 Torr and about 10 Torr, between about 10 Torr and about 100 Torr, between about 100 Ton and about 760 Torr, between about 1 atmosphere and about 2 atmospheres, or above about two atmospheres.

In another set of embodiments, the deposition of alternating indium-rich and indium-poor layers is performed by MOCVD, but using a time-varying gas flow rather than by means of physical motion of the substrate. In one specific embodiment, the reactor in which the alternating flows of metalorganic gases is performed is a tubular reactor. Examples of a suitable reactor are described by SP DenBaars and PD Dapkus, Appl. Phys. Lett. 51, 1530 (1987) and by MA Khan et al., Appl. Phys. Lett. 60, 1366 (1992), which are hereby incorporated by reference in their entirety. Note, however, that the inventive procedure is very different than that described by the aforementioned authors. The instant process involves alternative exposure to indium-rich and indium-poor (e.g., gallium rich) metalorganic gas streams with continuous exposure to a nitrogen-containing gas, for example, ammonia. The aforementioned authors teach alternating exposures to a metalorganic gas stream and an ammonia gas stream to achieve atomic layer epitaxy. A suitable sequence of gas flows is shown schematically in FIG. 5. Time-traces 501 and 503 may be taken to represent the flow of metalorganic gas and of carrier gas, respectively, in the indium-rich gas stream. The carrier gas flow is on when the metalorganic gas flow is off, and vice-versa, so that the overall gas flow rate is approximately constant. Time-traces 505 and 507 may be taken to represent the flow of metalorganic gas and of carrier gas, respectively, in the indium-poor gas stream. The carrier gas flow is on when the metalorganic gas flow is off, and vice-versa, so that the overall indium-poor gas flow rate is approximately constant. The flow of indium-rich metalorganic gas is off while the flow of indium-poor metalorganic gas is on, and vice-versa. The on-times of the metalorganic gases may be shorter than the off-times, allowing for separation in time of the indium-rich and indium-poor metalorganic gas streams impinging on the substrate. The flow of nitrogen-containing gas, for example, ammonia, may be approximately constant during this sequence.

In still another set of embodiments, the deposition of alternating indium-rich and indium-poor layers is performed by MOCVD using a time-varying gas flow and a showerhead with at least two chambers and interpenetrating gas nozzles. One version of a showerhead is known as a Close Coupled Showerhead, a registered trademark of Aixtron AG. Another suitable showerhead is shown schematically in FIG. 6. Substrate 601 is placed proximate to susceptor 610 and to showerhead 600. Showerhead 600 comprises a first chamber 647 with array of outlet nozzles 645, second chamber 651 with array of outlet nozzles 649, and may further comprise third chamber 655 with array of outlet nozzles 653. In some embodiments showerhead 600 further comprises a fourth chamber with an array of outlet nozzles, a fifth chamber with an array of outlet nozzles, and the like. In a preferred embodiment, the time constant of each chamber, that is, the volume of the chamber divided by the product of the number of nozzles and the conductance of each nozzle, is less than about 3 seconds, less than about 1 second, less than about 0.3 second, or less than about 0.1 second. The showerhead design may facilitate scaleup of the reactor to large substrate diameters and/or to large number of substrates while retaining relatively high Peclet numbers, which is desirable for efficient switching of gas flow composition quickly. The showerhead may also minimize pre-reaction between the group III precursors and the nitrogen-containing gas. The reactor may be further equipped with one or more wires 680 positioned proximate to the substrate(s).

Referring again to FIG. 5, time-traces 501 and 503 may be taken to represent the flow of metalorganic gas and of carrier gas, respectively, in an indium-rich gas stream flowing through a first chamber in the showerhead. The carrier gas flow is on when the metalorganic gas flow is off, and vice-versa, so that the overall gas flow rate is approximately constant. Time-traces 505 and 507 may be taken to represent the flow of metalorganic gas and of carrier gas, respectively, in an indium-poor gas stream flowing through a second chamber in the showerhead. The carrier gas flow is on when the metalorganic gas flow is off, and vice-versa, so that the overall indium-poor gas flow rate is approximately constant. The flow of indium-rich metalorganic gas is off while the flow of indium-poor metalorganic gas is on, and vice-versa. The on-times of the metalorganic gases may be shorter than the off-times, allowing for separation in time of the indium-rich and indium-poor metalorganic gas streams impinging on the substrate. A flow of nitrogen-containing gas, for example, ammonia, may be approximately constant during this sequence. The flow of nitrogen-containing gas may mixed into the gas flow of the indium-rich and/or the indium-poor gas flow streams or may be admitted separately through a separate (e.g., third) chamber of the showerhead.

The absolute and relative rates of deposition of indium-rich and indium-poor layers may be adjusted by setting the flow rate and mole fraction of the indium-rich and the indium-poor metalorganic sources, the flow of nitrogen-containing gas, the reactor pressure, and the substrate temperature to pre-determined values. The number of alternating layers may be adjusted by setting the deposition time and the cycle time for the alternating gas flows to pre-determined values. The pressure at which the MOCVD is performed may be below about 1 Torr, between about 1 Torr and about 10 Torr, between about 10 Torr and about 100 Torr, between about 100 Torr and about 760 Torr, between about 1 atmosphere and about 2 atmospheres, or above about two atmospheres.

In another set of embodiments, an In-containing film is nucleated and deposited by atomic layer epitaxy (ALE). ALE has been used to deposit a number of binary compounds and semiconductor materials [T. Suntola, Materials Science Reports 4, 265 (1989); M. A. Khan, R. A. Skogman, J. M. Van Hove, D. T. Olson, and J. N. Kuznia, Appl. Phys. Lett. 60, 1366 (1992)] but, to the best of our knowledge, has not been applied to InGaN. The deposition of In-containing layers and Ga-containing layers may be performed either simultaneously or sequentially. Without wishing to be limited by theory, we believe that the alternating deposition of group III and nitride monolayers may avoid differential indium incorporation into facets of differing crystallographic orientation, as occurs during typical continuous growth. In preferred embodiments, the Peclet number of the gas flow is greater than 1, greater than 2, greater than 5, greater than 10, or greater than 100. The pressure at which the ALE is performed may be below about 1 Torr, between about 1 Torr and about 10 Torr, between about 10 Torr and about 100 Ton, between about 100 Torr and about 760 Torr, between about 1 atmosphere and about 2 atmospheres, or above about two atmospheres.

Figure 6:
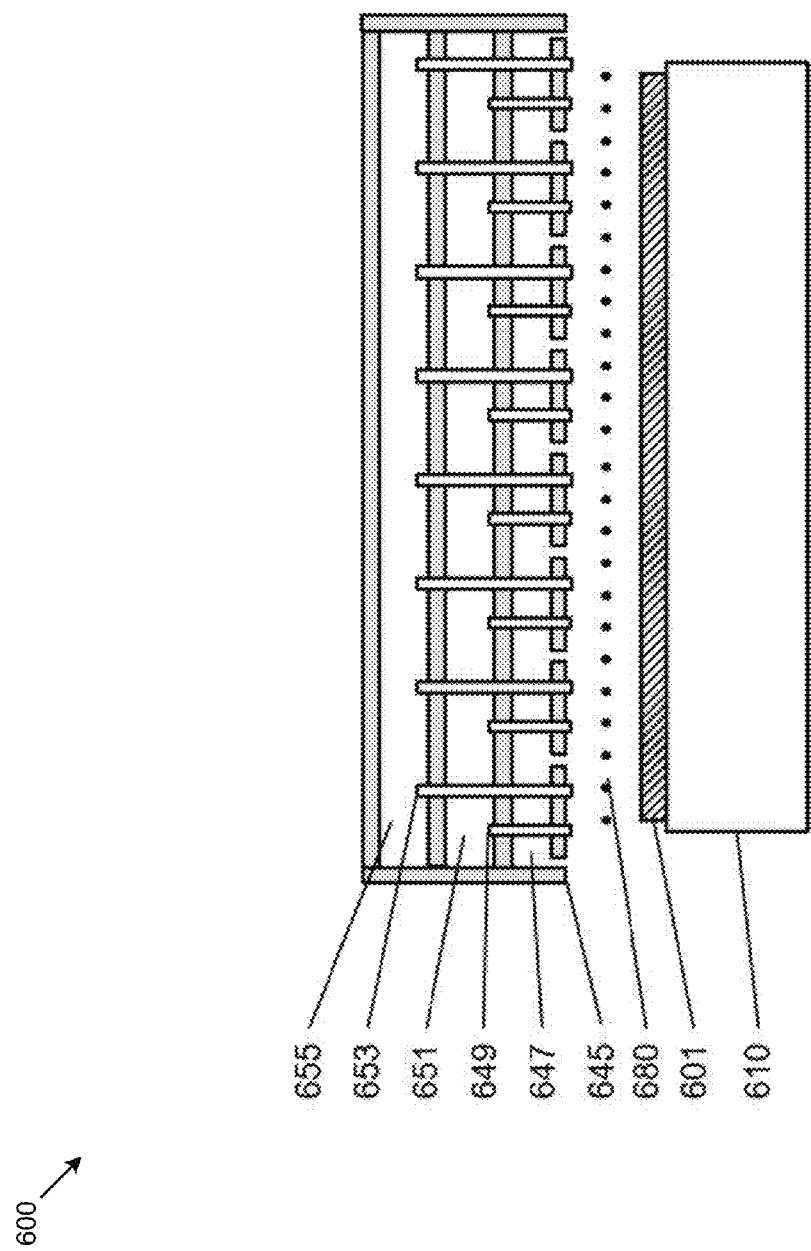
FIG. 6 illustrates a showerhead system for processing a substrate according to an embodiment of the present disclosure.

In one set of embodiments, the ALE is performed using metalorganic precursors in a reactor equipped with a showerhead gas inlet with at least two interpenetrating gas pathways, as illustrated in FIG. 6. Referring again to FIG. 5, time-traces 501 and 503 may be taken to represent the flow of mixed metalorganic gas (that is, with a common indium mole fraction) and of carrier gas, respectively, flowing through a first chamber in the showerhead. The carrier gas flow is on when the metalorganic gas flow is off, and vice-versa, so that the overall gas flow rate is approximately constant. Time-traces 505 and 507 may be taken to represent the flow of nitrogen-containing and of carrier gas, respectively, flowing through a second chamber in the showerhead. The carrier gas flow is on when the nitrogen-containing gas flow is off, and vice-versa, so that the overall gas flow rate is approximately constant. The flow of metalorganic gas is off while the flow of nitrogen-containing gas is on, and vice-versa. The on-times of the metalorganic and nitrogen-containing gases may be shorter than the off-times, allowing for separation in time of the metalorganic and nitrogen-containing gas streams impinging on the substrate. In a preferred embodiment, the metalorganic mole fraction and flow rate, the mole fraction and flow rate of nitrogen-containing gas, the respective on-times, the reactor pressure, and the substrate temperature are chosen so that approximately one monolayer of indium-containing nitride is deposited per cycle. In this specific embodiment the mole fraction of indium in the indium-containing nitride layer is controlled by the mole fractions of indium-containing and indium-free (for example, gallium-containing) metalorganic precursors, along with the other reaction parameters. The rate of deposition is controlled by the cycle time (one monolayer per cycle), and the thickness of the layer by the deposition time (number of cycles). The pressure at which the ALE is performed may be below about 1 Torr, between about 1 Torr and about 10 Torr, between about 10 Torr and about 100 Torr, between about 100 Torr and about 760 Torr, between about 1 atmosphere and about 2 atmospheres, or above about two atmospheres.

Figure 7:
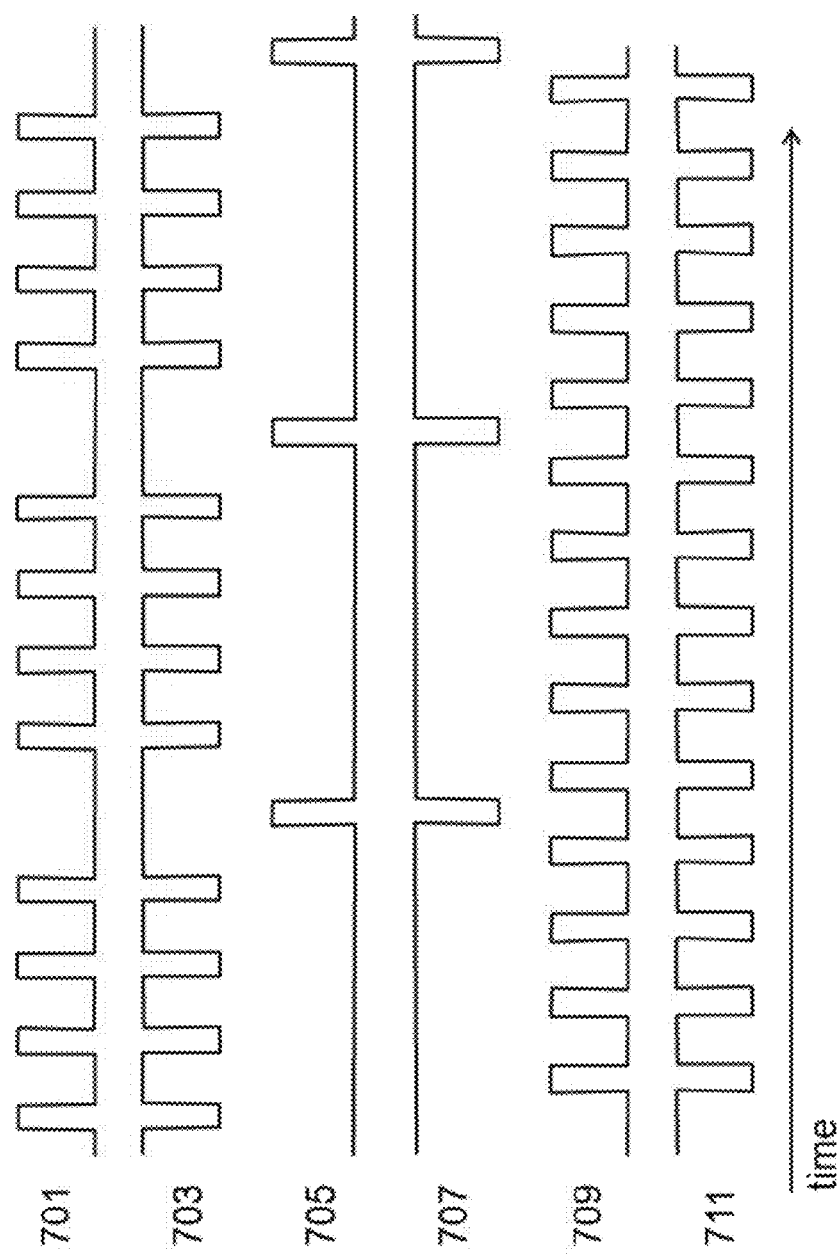
FIG. 7 is a simplified diagram illustrating a gas flow system for processing a substrate according to an embodiment of the present disclosure.

In another embodiment, ALE is performed with metalorganic precursors, but deposition of indium-rich and indium-poor layers (preferably, monolayers) is performed separately. Referring to FIG. 7 and making reference again to FIG. 6, time-traces 701 and 703 may be taken to represent the flow of indium-poor metalorganic gas (for example, gallium-rich) and of carrier gas, respectively, flowing through a first chamber in the showerhead. The carrier gas flow is on when the indium-poor metalorganic gas flow is off, and vice-versa, so that the overall gas flow rate is approximately constant. Time-traces 705 and 707 may be taken to represent the flow of indium-rich metalorganic gas and of carrier gas, respectively, flowing through a second chamber in the showerhead. The carrier gas flow is on when the indium-rich metalorganic gas flow is off, and vice-versa, so that the overall gas flow rate is approximately constant. Time-traces 709 and 711 may be taken to represent the flow of nitrogen-containing gas and of carrier gas, respectively, flowing through a third chamber in the showerhead. The carrier gas flow is on when the nitrogen-containing gas flow is off, and vice-versa, so that the overall gas flow rate is approximately constant. The flow of metalorganic gases is off while the flow of nitrogen-containing gas is on, and vice-versa. The on-times of the metalorganic and nitrogen-containing gases may be shorter than the off-times, allowing for separation in time of the metalorganic and nitrogen-containing gas streams impinging on the substrate. In a preferred embodiment, the metalorganic mole fraction and flow rate, the mole fraction and flow rate of nitrogen-containing gas, the respective on-times, the reactor pressure, and the substrate temperature are chosen so that approximately one monolayer of indium-poor or indium-rich nitride is deposited per cycle of nitrogen-containing gas. In this specific embodiment the mole fraction of indium in the indium-containing nitride layer is controlled digitally, by the ratio of the number of indium-rich and indium-poor (for example, gallium-containing) metalorganic precursor pulses, along with the other reaction parameters. The rate of deposition is controlled by the cycle time (one monolayer per cycle), and the thickness of the layer by the deposition time (number of cycles). The pressure at which the ALE is performed may be below about 1 Torr, between about 1 Torr and about 10 Torr, between about 10 Torr and about 100 Torr, between about 100 Torr and about 760 Torr, between about 1 atmosphere and about 2 atmospheres, or above about two atmospheres.

In still another embodiment, ALE is performed by HVPE, but deposition of indium-rich and indium-poor layers (preferably, monolayers) is performed separately. Referring to FIG. 7 and making reference again to FIG. 4, time-traces 701 and 703 may be taken to represent the flow 427 of halogen-containing gas and of carrier gas, respectively, flowing through the indium-poor source 421. The carrier gas flow is on when the halogen-containing gas flow is off, and vice-versa, so that the overall gas flow rate is approximately constant. Time-traces 705 and 707 may be taken to represent the flow 417 of halogen-containing gas and of carrier gas, respectively, flowing through the indium-rich source 411. The carrier gas flow is on when the halogen-containing gas flow is off, and vice-versa, so that the overall gas flow rate is approximately constant. Time-traces 709 and 711 may be taken to represent the flow 419 of nitrogen-containing gas and of carrier gas, respectively, flowing through the body of the reactor. The carrier gas flow is on when the nitrogen-containing gas flow is off, and vice-versa, so that the overall gas flow rate is approximately constant. The flow of halogen-containing gases is off while the flow of nitrogen-containing gas is on, and vice-versa. The on-times of the halogen-containing and nitrogen-containing gases may be shorter than the off-times, allowing for separation in time of the halogen-containing and nitrogen-containing gas streams impinging on the substrate. In a preferred embodiment, the indium-rich and indium-poor source temperatures, flow rates of halogen-containing gases, the mole fraction and flow rate of nitrogen-containing gas, the respective on-times, the reactor pressure, and the substrate temperature are chosen so that approximately one monolayer of indium-poor or indium-rich nitride is deposited per cycle of nitrogen-containing gas. In this specific embodiment the mole fraction of indium in the indium-containing nitride layer is controlled digitally, by the ratio of the number of indium-rich and indium-poor (for example, gallium-containing) halogen-containing pulses, along with the other reaction parameters. The rate of deposition is controlled by the cycle time (one monolayer per cycle), and the thickness of the layer by the deposition time (number of cycles). The pressure at which the ALE is performed may be below about 1 Torr, between about 1 Torr and about 10 Torr, between about 10 Torr and about 100 Torr, between about 100 Torr and about 760 Torr, between about 1 atmosphere and about 2 atmospheres, or above about two atmospheres.

The substrate may undergo a pre-treatment prior to depositing an In-containing nitride layer. The pre-treatment may include heating to a temperature between about 500° C. and about 1200° C. in vacuum or in an atmosphere comprising at least one of $H_2$ and $NH_3$.

An indium-containing nitride nucleation layer may be deposited. The surface may be exposed to a flux comprising an indium-containing precursor and a nitrogen-containing precursor. The indium-containing precursor may comprise $In(R_1R_2R_3)$, where each of $R_1$, $R_2$, and $R_3$ are alkyl and/or aryl groups. In one specific embodiment, the indium-containing precursor comprises triethylindium, $In(C_2H_5)_3$. In another specific embodiment, the indium-containing precursor comprises trimethylindium, $In(CH_3)_3$. In still another specific embodiment, the indium-containing precursor comprises cyclopentadienylindium, $C_5H_5In$. In yet another specific embodiment, the indium-containing precursor comprises pentamethylcyclopentadienylindium, $(CH_3)_5C_5In$. In another set of embodiments, the indium-containing precursor comprises an indium halide, $InX_a$, where X represents F, Cl, Br, and/or I, and a=1, 2, or 3. In a specific embodiment, the indium-containing precursor comprises InCl or $InCl_3$. The nitrogen-containing precursor may comprise at least one of ammonia, $NH_3$, nitrogen, $N_2$, hydrazine, $N_2H_4$, and hydrazoic acid, $HN_3$. The surface may additionally be exposed to a flux comprising a gallium-containing precursor and/or an aluminum-containing precursor. The gallium-containing precursor may comprise $Ga(R_1R_2R_3)$, where each of $R_1$, $R_2$, and $R_3$ are alkyl and/or aryl groups. In one specific embodiment, the gallium-containing precursor comprises triethylgallium, $Ga(C_2H_5)_3$. In another specific embodiment, the gallium-containing precursor comprises trimethylgallium, $Ga(CH_3)_3$. In another set of embodiments, the gallium-containing precursor comprises a gallium halide, $GaX_a$, where X represents F, Cl, Br, and/or I, and a=1, 2, or 3. In a specific embodiment, the gallium-containing precursor comprises GaCl or $GaCl_3$. The aluminum-containing precursor may comprise $Al(R_1R_2R_3)$, where each of $R_1$, $R_2$, and $R_3$ are alkyl and/or aryl groups. In one specific embodiment, the aluminum-containing precursor comprises triethylaluminum, $Ga(C_2H_5)_3$. In another specific embodiment, the aluminum-containing precursor comprises trimethylaluminum, $Ga(CH_3)_3$. In still another specific embodiment, the aluminum-containing precursor comprises trimethylaminealane, $(CH_3)_3NAlH_3$. In another set of embodiments, the aluminum-containing precursor comprises an aluminum halide, $AlX_a$, where X represents F, Cl, Br, and/or I, and a=1, 2, or 3. In a specific embodiment, the aluminum-containing precursor comprises AlCl or $AlCl_3$.

During the exposure of the surface to a flux comprising an indium-rich precursor, an indium-poor precursor, and/or a nitrogen-containing precursor, the substrate may be held at a first temperature between about 300° C. and about 500° C. The pressure in the reactor may be maintained at a value between about $10^{-5}$ Torr and about 10 atmospheres. In some embodiments, the pressure is maintained at a value between about $10^{-5}$ Torr and about 1 Torr. In other embodiments, the pressure is maintained at a value between about 1 Torr and about 600 Torr. In still other embodiments, the pressure is maintained at a value between about 0.9 atmospheres and about 1.2 atmospheres. In still other embodiments, the pressure is maintained at a value between about 1.3 atmospheres and about 10 atmospheres. The one or more wires positioned proximate to the surface may be held at a temperature between about 500° C. and about 2500° C., causing partial or complete decomposition of at least one of an indium-containing precursor, a gallium-containing precursor, an aluminum-containing precursor, and a nitrogen-containing precursor. A DC electrical bias between about 1 volt and about 1000 volts may be placed between the one or more wires positioned proximate to the surface and the surface. In one set of embodiments, the surface is biased positively with respect to the one or more wires, causing the substrate to be bombarded by electrons generated thermionically from the one or more wires. In another set of embodiments, the surface is biased negatively with respect to the one or more wires, causing bombardment of the substrates by ions. In some embodiments, a plasma is generated in the region between the one or more wires and the substrate. In some embodiments, an AC bias is placed between the one or more wires and the substrate. In some embodiments, the AC bias is modulated at radio frequencies (rf). In some embodiments, a DC or AC bias is placed between the one or more wires and the substrate only during certain portions of a cycle of time-varying gas flows. For example, referring to FIGS. 5 and 7, a DC or AC bias may be placed between the one or more wires and the substrate during exposure of the substrate to one or more of an indium-rich gas flow, an indium-poor (but metal containing) gas flow, a nitrogen-containing gas flow, or a gas flow comprising carrier gas only. Without wishing to be bound by theory, we believe that the addition of energy by means of the at least one hot wire, electron bombardment or irradiation, ion bombardment, a plasma, or the like, facilitates partial or complete decomposition of at least one of a an indium-containing precursor and a nitrogen-containing precursor and enables deposition of an indium-containing nitride film at a lower substrate temperature than would be feasible in the absence of the energy. In another embodiment, a microwave plasma is provided proximate to the surface region of the substrate. The thickness of the nucleation layer may be between about 10 Ångstroms and about 1000 Ångstroms.

The temperature of the surface may be ramped to a second temperature higher than the first temperature. The second temperature may be between about 500° C. and about 900° C. The heating rate may be between about 0.1° C. per minute and about 100° C. per minute. The surface may be exposed to a flux of at least one of an indium-rich precursor, an indium-poor but metal-containing precursor, and a nitrogen-containing precursor during the temperature ramp. The fluxes of one or more precursors during the ramp may be lower, equal, or higher than the corresponding flux during deposition of the nucleation layer.

After the substrate reaches the second temperature, a well-crystallized layer of indium-containing nitride is deposited. The surface may be exposed to a flux comprising at least one indium-containing precursor and at least one nitrogen-containing precursor. The surface may additionally be exposed to a flux comprising at least one gallium- and/or aluminum-containing precursor. Additional energy may be provided during the deposition via hot wires, electron bombardment, ion bombardment, plasma excitation, or the like. The thickness of the well-crystallized layer may be between about 10 nanometers and about 100 millimeters, or between about 100 nanometers and about 10 microns.

In another set of embodiments, an In-containing film is nucleated and deposited using molecular beam epitaxy (MBE). An advantage of this technique is the ability to deposit or grow high quality InGaN films at significantly lower temperatures (e.g. lower than about 700° C. and as low as about 300° C.) relative to vapor deposition techniques such as MOCVD, HVPE and other growth techniques which typically require temperatures greater than about 700° C. In particular, an advantage of MBE is that the source materials for growth do not require elevated substrate temperatures in order to be available for growth at the surface of a substrate. In a preferred embodiment, conventional Knudsen cells ("K-cells") are used to contain high purity elemental group III sources such as Ga, In, and Al, among others. Such cells are commonly used in MBE growth and are extremely well-known in the art. Such cells provide group III source elements at a growth surface in an MBE growth chamber through evaporation in a molecular beam under appropriate temperature and pressure conditions and with the cells appropriately positioned relative to the growth surface. These conditions are independent of the substrate temperature or "growth temperature" making possible element and/or layer deposition and/or crystal growth at very low temperatures.

Similarly, active group V (nitrogen) species for growth can be provided at the substrate surface in an MBE growth chamber in a manner which does not rely on or require elevated substrate temperatures. Specifically, in a preferred embodiment the source of active nitrogen for growth is a radio frequency plasma source. In this embodiment a nitrogen plasma is provided in the growth chamber, and is directed at the growth surface or substrate, which contains one or more active nitrogen species for growth. The nitrogen source could alternatively comprise an ammonia gas injector, or a combination of ammonia gas and nitrogen plasma in order to provide active nitrogen species for growth.

Additionally, it is well-known in the art that for MBE growth, elemental cells or sources (gas and/or solid sources) are each equipped with a shutter in the vicinity of the outlet of the cell or source. Shutters are opened or closed in order to provide or prohibit, respectively, fluxes of source elements and/or gases at the growth surface or substrate. In one embodiment, the MBE deposition is performed with both group III (e.g. Ga and In) and group V (e.g. N) shutters open to expose fluxes of constituent elements to the growth surface or substrate. In a preferred embodiment, the total group III/group V flux ratio during growth is maintained to be greater than 1. Group III fluxes in the range of about $10^{-7}$ to $10^{-6}$ Torr beam equivalent pressure (BEP) can be utilized to achieve this condition for nitrogen-limited growth rates of about 0.1-0.5 microns/hour. This condition is known as "metal-rich" growth and provides for a build-up of the excess group III element on the surface known as the "wetting layer". Such a wetting layer has been shown to be advantageous for increasing surface adatom mobilities and hence promoting higher quality 2-D growth modes such as step flow growth or layer-by-layer growth rather than 3-D Volmer-Weber (island) or Stranski-Krastanov (layer-plus-island) growth modes. The presence or absence of a metallic wetting layer and the exact thickness of the wetting layer (in monolayers) can be actively monitored and controlled during MBE growth by two techniques: Reflection high energy electron diffraction (RHEED) and quantitative mass spectroscopy (QMS) [refs].

In another embodiment, growth can be initiated with a total group III/group V flux ratio of less than 1 and then the conditions changed in a second or later step of the growth to achieve a total group III/group V flux of greater than 1. In this case roughened surfaces may be obtained during the initial growth due to dramatically reduced adatom surface mobility, but the subsequent presence of a metallic wetting layer in later steps of the growth has been shown to provide for surface recovery to smooth surfaces and high quality reduced-dislocation heteroepitaxial GaN films. Further, if the total group III/group V flux is much greater than 1, metallic droplets of the excess group III element can form on the surface which can be undesirable. In this case a pulsed growth method can be employed during which all shutters are closed periodically to allow in-situ desorption of excess group III. In a preferred embodiment a short-period pulsed growth is utilized for InGaN heteroepitaxy over large area substrates. This embodiment is advantageous for obtaining high quality InGaN films over large areas and provides a more highly manufacturable method due to reduced sensitivity to temperature variations which may occur across a large area substrate during growth. In this embodiment, a large-area substrate (for example, 2", 4", 6" substrate) is first exposed to a high flux of Indium and/or group III and group V elements with a III/V ratio>>1, such that cooler areas may accumulate metallic group III droplets and warmer areas maintain a wetting layer of 1-2 monolayers but do not accumulate droplets due to competing desorption of species in hotter areas. Periodically, the excess group III elements are allowed to desorb in-situ returning the growth surface to the pre-growth state in terms of adatom coverage and then the process is repeated.

In some cases, growth initiation under metal-rich or high group III/group V ratios may not be desirable due to unwanted reactions between constituent elements of the substrate material and the group III sources. For example, (Al, In, Ga)N growth on Si or SiC during which Si can dissolve into Ga or Al and will incorporate into films, or (Al,In,Ga) N growth on GaAs during which As can incorporate into the growing film and alter the crystal structure from wurtzite to cubic, for example. In such cases, a multiple step growth which is initiated under group V-rich conditions and later changed to group III-rich conditions would be desirable.

In another embodiment, shutters are alternated between group III and group V at specified intervals. In yet other embodiments, growth interrupts or pauses are incorporated during which time one or more shutters are closed for specified lengths of time in order to enhance adatom surface mobility and provide for higher quality growth. This type of technique is known as migration enhanced epitaxy (MEE).

In some embodiments, the shutters are opened and closed in a predetermined way so as to deposit alternating layers of an indium-rich nitride and an indium-poor nitride. In one specific embodiment, the shutters are opened and closed in a predetermined way so as to deposit alternating layers of an InN and GaN.

Thus MBE offers several advantages for direct deposition of heteroepitaxial InGaN. Further, since growth temperatures are lower, high quality InGaN crystals can be grown across the whole compositional range.

In the above embodiments using MBE growth, one side of the substrate may first be coated with a metal such as Ti or Pt, a refractory metal such as W, Mo, Ta, a silicide or nitride of one of these metals, among others, or any combination of these, in order to facilitate heat transfer to the substrate during MBE growth. The thickness of the metal containing layers may range in thickness from 0.5 to 2 microns, but is not limited to this range. The metal containing layers may be deposited by e-beam evaporation, sputtering, chemical vapor deposition, plasma-enhanced chemical vapor deposition, or a combination of these or other deposition techniques. The substrate may then be de-greased in solvents such as, but not limited to, acetone, methanol and isopropanol, with or without use of an ultrasonic bath, and spin-dried or nitrogen blow-dried.

The prepared substrate may then be mounted on a substrate holder with the metalized surface facing the direction of the heater during growth, and loaded into a chamber of the MBE system. The type of sample mounting and the configuration of the substrate holder may vary depending on the type and geometry of the MBE system being used. The substrate holder could include, but is not limited to, ceramic diffuser plates, backing wafers such as silicon, quartz, or sapphire, molybdenum, ceramic, or tungsten retaining rings, and molybdenum or tantalum faceplates, for example. In some cases the substrate could be indium-bonded to a carrier wafer such as silicon prior to placement in the substrate holder. The substrate and holder may then be baked at high temperature, for example in the range of 100-800° C., and more typically in the range of 400° C.-600° C., prior to growth. The baking may be performed in the growth chamber or preferably in a separate chamber which is attached to the growth chamber, for ~1 hour or a sufficient amount of time to outgas water and other impurities from the surface. The outgassing can be monitored by the chamber pressure and potentially using a residual gas analyzer. In one embodiment, the growth chamber of the MBE system is equipped with a radio frequency plasma source, an ammonia gas injector, a combination of these, or another suitable source of active nitrogen for growth. The inlet nitrogen source gas is preferably further purified using a getter-filter prior to introduction to the growth chamber. Conventional Knudsen cells are available for group III sources such as Ga and In. Pumping of any or all of the MBE system chambers to vacuum pressures can be achieved utilizing cryogenic pumps, turbo pumps, ion pumps, among others, or a combination of these. Base pressures of the growth chamber prior to introducing source gases is typically in the range of $10^{-8}$-$10^{-10}$ Torr, and preferably on the order of $10^{-10}$ Torr or less.

InGaN, InN, and/or GaN may be deposited in the temperature range of about 300° C. to about 700° C., and preferably in the range of about 400° C.-600° C. In one embodiment, the growth pressure is 1 the range of about $1 \times 10^{-5}$ to $1 \times 10^{-6}$ Torr. It is possible that dopants could be intentionally incorporated in the epitaxial layers. A typical n-type dopant is Si, a typical p-type dopant is Mg, and typical compensating dopants are Be or C, for example. Under certain conditions Mg doping can result in polarity inversion in GaN. If Mg doping is utilized the appropriate conditions should be utilized to control polarity.

After MBE growth, the sample is removed from the chamber. The metal containing layer on backside of the substrate can be removed by wet etching in hydrofluoric acid, hydrochloric acid, nitric acid, sulfuric acid, among others, or a combination of these. The metal containing layer could also be removed by dry etching techniques such as RIE.

The indium-containing film may be annealed, that is, subjected to a thermal treatment, to improve crystallinity and/or to promote relaxation. The thermal or annealing treatment may comprise heating to a temperature above 600 degrees Celsius, above 700 degrees Celsius, above 800 degrees Celsius, above 900 degrees Celsius, or above 1000 degrees Celsius for a period between about 1 second and about 4 hours. To inhibit decomposition, a capping layer may be deposited on the indium-containing film prior to the thermal or annealing treatment. The capping layer may comprise at least one of GaN, AN, AlGaN, $SiO_2$, and $SiN_x$. At least an outermost portion of the indium-containing film has a wurtzite structure, is substantially relaxed and unstrained, and is well-crystallized. The x-ray diffraction full-width-at-half-maximum (FWHM) of the lowest-order on-axis (symmetric) reflection may be less than about 500 arc-sec, less than about 300 arc-sec, less than about 200 arc-sec, less than about 150 arc-sec, or less than about 100 arc-sec. The x-ray diffraction full-width-at-half-maximum of the lowest-order off-axis (asymmetric) reflection may be less than about 1000 arc-sec, less than about 800 arc-sec, less than about 500 arc-sec, less than about 300 arc-sec, less than about 200 arc-sec, less than about 150 arc-sec, or less than about 100 arc-sec. In a specific embodiment, the indium-containing film has a c-plane orientation, an x-ray rocking-curve (002) reflection FWHM less than about 300 arc-sec and a (102) reflection FWHM less than about 1000 arc-sec. In another specific embodiment, the indium-containing film has a c-plane orientation, an x-ray rocking-curve (002) reflection FWHM less than about 150 arc-sec and a (102) reflection FWHM less than about 300 arc-sec.

In some embodiments, an additional indium-containing nitride layer is deposited. The second deposition may be performed in a second reactor, after cooldown from the second temperature and removal from the first reactor. In some embodiments, the second deposition is performed using MOCVD. In other embodiments, the second deposition is performed using hydride vapor phase epitaxy (HVPE). The additional indium-containing nitride layer may have a thickness between about 1 micron and about 100 millimeters, or between about 20 microns and about 10 millimeters, or between about 100 microns and about 5 millimeters. The additional deposition thickness can assist in reducing threading dislocation density, and thus improve crystallinity of the indium-containing nitride layer.

In some embodiments, the indium-containing nitride layer is removed from the substrate. The substrate may be removed by spontaneous delamination, by laser liftoff, by selective chemical etching, or the like, according to methods that are known in the art, to produce a free-standing indium-containing nitride boule or wafer. It is to be appreciated that the indium-containing nitride layer provided by the methods described in this invention is substantially near its native, strain-free state. For example, the in-plane lattice constant for a (0001) indium-gallium-nitride of the present invention will be higher than that of GaN (3.19 Å). In particular, the in-plane lattice constant of the (0001) indium-gallium-nitride layer may be greater than 3.20 Å, greater than 3.22 Å, greater than 3.24 Å, greater than 3.26 Å, or greater than 3.28 Å. The relationship between materials parameters and compositions for semiconductor alloys are described, for example, in I. Vurgaftman, J. R. Meyer, and L. R. Ram-Mohan, J. Appl. Phys. 89, 11, pp. 5815-5875 (2001), which is hereby incorporated by reference in its entirety. Therefore, the teachings in this invention provide a large-area, homogeneous, near-strain-free indium-containing nitride layer which overcomes the limitations of the prior art and can be employed for improved optoelectronic devices.

One or more active layers may be deposited on the well-crystallized indium-containing nitride layer. The active layer may be incorporated into an optoelectronic or electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation.

While the above is a full description of the specific embodiments, various modifications, alternative constructions and equivalents may be used. Therefore, the above description and illustrations should not be taken as limiting the scope of the present disclosure which is defined by the appended claims.

What is claimed is:

1. A method for fabricating a gallium, indium, and nitrogen containing material, the method comprising:
   providing a substrate having a surface region;
   forming a first thickness of material having a first indium-rich concentration;
   forming a second thickness of material having a first indium-poor concentration overlying the first thickness of material;
   forming a third thickness of material having a second indium-rich concentration overlying the second thickness of material to form a sandwiched structure comprising at least the first thickness of material, the second thickness of material, and third thickness of material; and
   processing the sandwiched structure using at least a thermal process to cause formation of well-crystallized, relaxed material within a vicinity of a surface region of the sandwiched structure; and
   wherein the sandwiched structure has an overall thickness of 100 nm or greater.

2. A method for fabricating a gallium, indium, and nitrogen containing material, the method comprising:
   providing a substrate having a surface region;
   forming a first thickness of material having a first indium-rich concentration;
   forming a second thickness of material having a first indium-poor concentration overlying the first thickness of material;
   forming a third thickness of material having a second indium-rich concentration to form a sandwiched structure comprising at least the first thickness of material, the second thickness of material, and third thickness of material; and
   processing the sandwiched structure using at least a thermal process to cause formation of well-crystallized, relaxed material within a vicinity of a surface region of the sandwiched structure wherein
   the well-crystallized, relaxed material has a full-width-at-half-maximum of the lowest-order symmetric x-ray reflection of 300 arc-seconds or less; and
   the sandwiched structure has an overall thickness of 100 nm or greater.

3. The method of claim 2 wherein the substrate is selected from a material consisting of gallium nitride, aluminum nitride, sapphire, silicon carbide, $MgAl_2O_4$ spinel, ZnO, BP, $ScAlMgO_4$, $YFeZnO_4$, MgO, $Fe_2NiO_4$, $LiGa_5O_8$, $Na_2MoO_4$, $Na_2WO_4$, $In_2CdO_4$, $LiAlO_2$, $LiGaO_2$, $Ca_8La_2(PO_4)_6O_2$, lithium aluminate, gallium arsenide, silicon, germanium, or a silicon-germanium alloy.

4. The method of claim 2 wherein the thermal process causes formation of a substantially homogeneous region of crystalline material within a vicinity of a surface region of the sandwiched structure.

5. The method of claim 2 further comprising n thicknesses of material overlying the third thickness of material, where n is at least 10.

6. The method of claim 2 further comprising forming at least two of the thicknesses of material using an HPVE process comprising at least two different sources of group III metals.

7. The method of claim 2 wherein the forming of the first thickness of material comprising flowing a first halogen-containing gas over a first group III metal and wherein the forming of the second thickness of material comprises flowing a second halogen-containing gas over a second group III metal; and rotating a susceptor that is proximate to the substrate to cause sequential exposures to the first group III metal and the second group III metal.

8. The method of claim 2 wherein the first thickness of material is formed in a first zone and the second thickness of material is formed in a second zone.

9. The method of claim 2 wherein the forming of the first thickness of material comprises flowing a first alternating sequence comprising a first halogen-containing gas and a first carrier gas over a first group III metal and wherein the forming of the second thickness of material comprises flowing a second alternating sequence comprising a second halogen-containing gas and a second carrier gas over a second group III metal; and controlling the timing of the first alternating sequence and the second alternating sequence so as to cause sequential exposures to the first group III metal and the second group III metal.

10. The method of claim 2 wherein the first thickness of material, the second thickness of material, and the third thickness of material are formed in a sequential and continuous manner.

11. The method of claim 2 further comprising providing a heating element within a vicinity of the surface region.

12. The method of claim 11 wherein the heating element is characterized by a temperature ranging from about 500 to about 2000 Degrees Celsius.

13. The method of claim 12 wherein the heating element is configured to increase a reaction rate of forming at least the first thickness of material.

14. The method of claim 2 wherein the first thickness of material comprises indium and nitrogen containing species; and the second thickness of material comprises a gallium and nitrogen containing species.

15. The method of claim 2 wherein the forming of the first thickness of material comprises a process selected from an electron bombardment process, a dc plasma process, an rf plasma process, or a microwave plasma process.

16. The method of claim 2 wherein the first thickness of material consists of a first mono-layer and the second thickness of material consists of a second mono-layer.

17. The method of claim 2 wherein the first thickness of material, the second thickness of material, and the third thickness of material are deposited by molecular beam epitaxy.

18. The method of claim 2 wherein the first thickness of material, the second thickness of material, and the third thickness of material are deposited by metalorganic chemical vapor deposition.

19. The method of claim 18 wherein at least two metalorganic precursor sources are introduced via separate chambers in a showerhead that is proximate to the substrate.

20. An indium, gallium and nitrogen containing substrate structure comprising:
a substrate having a surface region;
a first thickness of material having a first indium-rich concentration;
a second thickness of material having a first indium-poor concentration overlying the first thickness of material; and
a third thickness of material having a second indium-rich concentration overlying the second thickness of material to form a sandwiched structure comprising at least the first thickness of material, the second thickness of material, and third thickness of material; wherein
the sandwiched structure comprises well-crystallized, relaxed material within a vicinity of a surface region of the sandwiched structure; and
the sandwiched structure has an overall thickness of 100 nm or greater.

21. The method of claim 1, wherein the material having an indium-poor concentration comprises one or more of GaN, AlN, AlGaN, or a material having less than 5% InN.

22. The method of claim 1, wherein the material having an indium-poor concentration comprises $In_yGa_{1-y}N$ or $Al_xIn_yGa_{1-x-y}N$, wherein $0 \leq x \leq 1$ and $0 < y$, $x+y<1$, and y is less than 0.05.

23. The method of claim 1, wherein the material having an indium-rich concentration comprises one or more of InN, GaN, AlN, AlGaN, or a material having greater than 5% InN.

24. The method of claim 1, wherein the material having an indium-poor concentration comprises $In_yGa_{1-y}N$ or $Al_xIn_yGa_{1-x-y}N$, wherein $0 \leq x \leq 1$ and $0 < y$, $x+y<1$, and y is greater than 0.05.

* * * * *